United States Patent [19]

Kawamata et al.

[11] Patent Number: 5,523,567
[45] Date of Patent: Jun. 4, 1996

[54] SCANNING ELECTRON MICROSCOPE AND IMAGE FORMING METHOD THEREWITH

[75] Inventors: Shigeru Kawamata, Ooarai-machi; Susumu Ozasa, Kashiwa, both of Japan

[73] Assignees: Hitachi, Ltd., Tokyo; Hitachi Science Systems, Ltd., Katsuta, both of Japan

[21] Appl. No.: 330,458

[22] Filed: Oct. 28, 1994

[30] Foreign Application Priority Data

Nov. 4, 1993 [JP] Japan .................................. 5-275226

[51] Int. Cl.$^6$ .................................................. H01J 37/28
[52] U.S. Cl. ............................................ 250/310; 250/311
[58] Field of Search ..................................... 250/310, 311, 250/306, 307, 397

[56] References Cited

U.S. PATENT DOCUMENTS

| | | | |
|---|---|---|---|
| 4,553,030 | 11/1985 | Tokiwai et al. | 250/307 |
| 4,803,358 | 2/1989 | Kato et al. | 250/310 |
| 4,866,273 | 9/1989 | Kobayashi et al. | 250/310 |
| 5,276,325 | 1/1994 | Todokoro et al. | 250/310 |
| 5,367,318 | 11/1994 | Beaudin et al. | 345/201 |

FOREIGN PATENT DOCUMENTS

| | | |
|---|---|---|
| 0312082 | 4/1989 | European Pat. Off. . |
| 0533330 | 3/1993 | European Pat. Off. . |
| 4-74824 | 11/1992 | Japan . |

OTHER PUBLICATIONS

Review of Scientific Instruments, vol. 62, No. 4, Apr. 1991, New York, US, pp. 970–981; Matsuyama et al.: *A data acquisition and display system for spin–polarized scanning electron microscopy (spin SEM)*.

*Primary Examiner*—Bruce C. Anderson
*Attorney, Agent, or Firm*—Kenyon & Kenyon

[57] ABSTRACT

In an electron microscope for observing an image of a sample using secondary electrons emitted from the sample by two-dimensionally scanning an electron beam on the sample, a low magnification and wide view image of the sample is formed on one frame memory. The frame memory for storing on picture of the image is divided into an appropriate number of areas. The image data of the sample, obtained by consecutively moving the sample to the sample areas, is stored to the corresponding areas of the frame memory.

8 Claims, 3 Drawing Sheets

NORMAL IMAGE FORMING

SCANNING TIME T(s)
512-PIXEL SAMPLING

480 SCANNING LINES
480-LINE SAMPLING

↓ 1-FRAME SCANNING TIME 480×T(s)

512 PIXELS
480 LINES

LOW-MAGNIFICATION WIDE-VIEW IMAGE FORMING

SCANNING TIME T/4(s)
128-PIXEL SAMPLING

120 SCANNING LINES
120-LINE SAMPLING

↓ 1-SECTION SCANNING TIME $\frac{120}{4} \times T$(s)

128 PIXELS
120 LINES

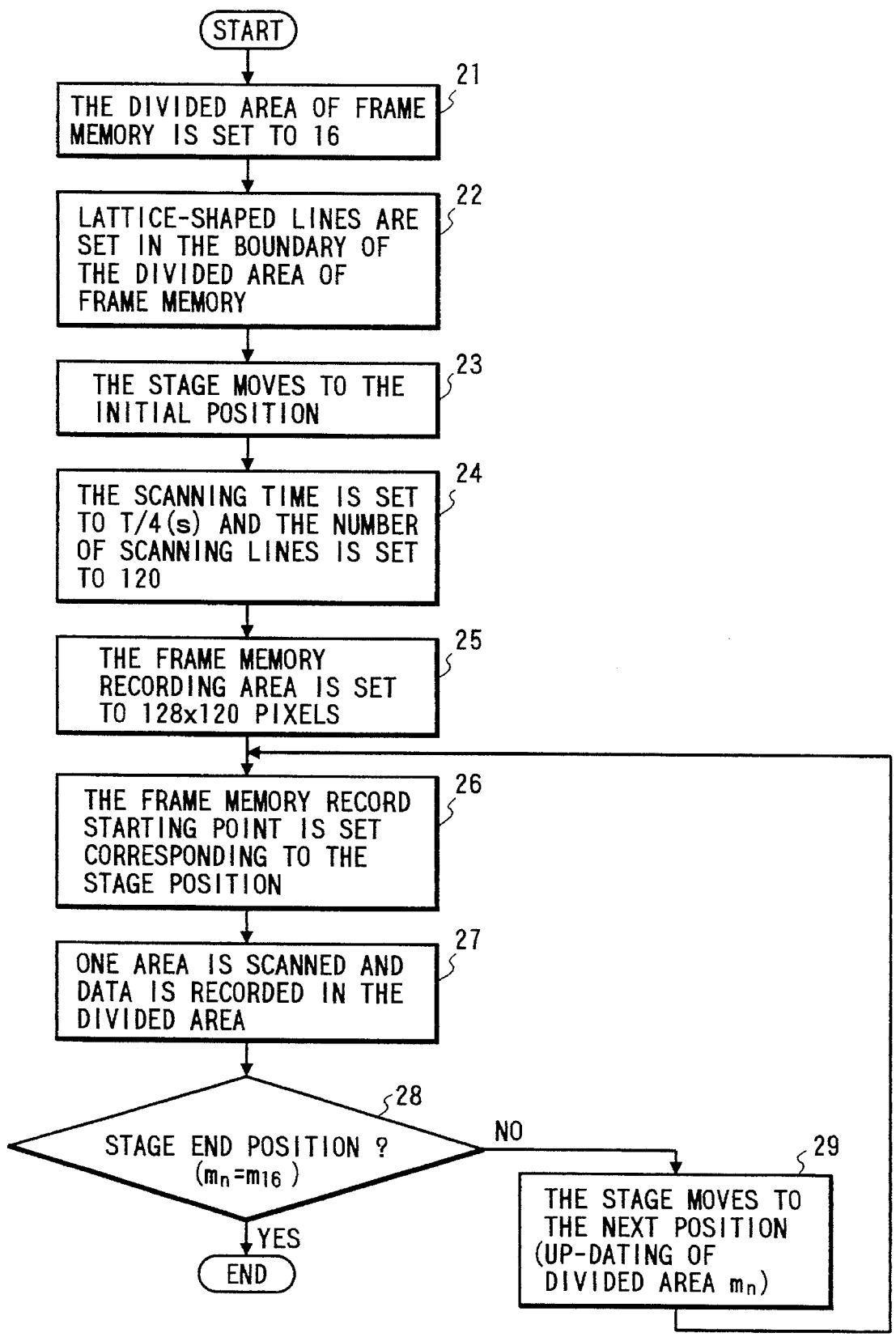

SCANNING ELECTRON MICROSCOPE AND IMAGE FORMING METHOD THEREWITH

BACKGROUND OF THE INVENTION

The present invention relates to a scanning electron microscope and an image forming method therewith.

In the scanning electron microscope, the user can observe an enlarged image at an optional location on the sample on the monitor. Since the enlarged image is of a part of the sample, it requires a lot of time to select the target field of view. When the sample is small, the entire sample can be observed at one time by setting the magnification ratio to the minimum magnification factor. However, to search for the field of view, the field of view is moved by stage movement through observation at the minimum magnification factor.

As a means for decreasing the apparent minimum magnification factor, there is a method for displaying an image at a very low magnification factor by stage movement and connection on the frame memory as described in Japanese Patent Publication No.4-74824 (1992). The method comprises dividing the surface of a measuring sample into a plurality of sections, scanning the surfaces of the sections with an electron beam, recording the image data for each section in each frame memory for one picture, reducing each of the plural images recorded in the frame memory, connecting the reduced images with each other to form and display a picture of very low magnification and wide view image.

Since very low magnification and wide view images beyond the electron beam scanning width can be displayed, such a prior art is effective in confirming the position of the target section on the screen. However, since image data of divided sections is recorded in the frame memory and the images are reduced and connected, to obtain very low magnification and wide view images, the frame scanning time for the number of divisions and the time for image reduction and connection are required in addition to the stage moving time, accordingly a very long period of time is necessary. For example, in the case where the surface of a sample is divided into 16 sections and the frame memories of 16 in number are used, the time necessary to form very low magnification factor images can be expressed by the following formula.

[Forming time of very low magnification and wide view image]=[15 times stage moving time]+[16 times frame scanning time]+[16 times image reducing time]+[connecting time].

A memory for frames for the number of divisions is necessary in addition to the very low magnification factor image frame memory. In the example described above, the necessary memory capacity is 17 frames including very low magnification and wide view images.

SUMMARY OF THE INVENTION

A main object of the present invention is to provide a scanning electron microscope and method of forming image therewith wherein the memory capacity to be used is small and very low magnification and wide view images can be obtained in a short time.

Another object of the present invention is to obtain a low magnification and wide view image with decreasing damage of a measuring sample by decreasing the irradiation amount of electron beam to the sample.

A main feature of the present invention is that by dividing a frame memory for one picture into a plurality of areas and sequentially moving a measuring sample to store a low magnification images of the measuring sample in said divided areas, low magnification and wide view images are formed in the frame memory for one picture.

Another feature of the present invention is that by decreasing the number of scanning beams to obtain the image data in each of said areas corresponding to the number of the divided areas and setting the scanning time short, the amount of electron beams irradiated on the measuring sample is decreased when obtaining a sheet of low magnification and wide view image.

Other objects and features of the present invention will be described in the following embodiment.

BRIEF DESCRIPTION OF THE DRAWINGS

FIG. 2 (A) shows when a normal image is formed, and FIG. 2 (B) shows when a low magnification and wide view image is formed.

FIG. 3 is a flow chart showing an embodiment of the execution procedure of the present invention.

DETAILED DESCRIPTION

The present invention will be described in detail below, referring to an embodiment shown in the accompanying drawings.

Figure 1:
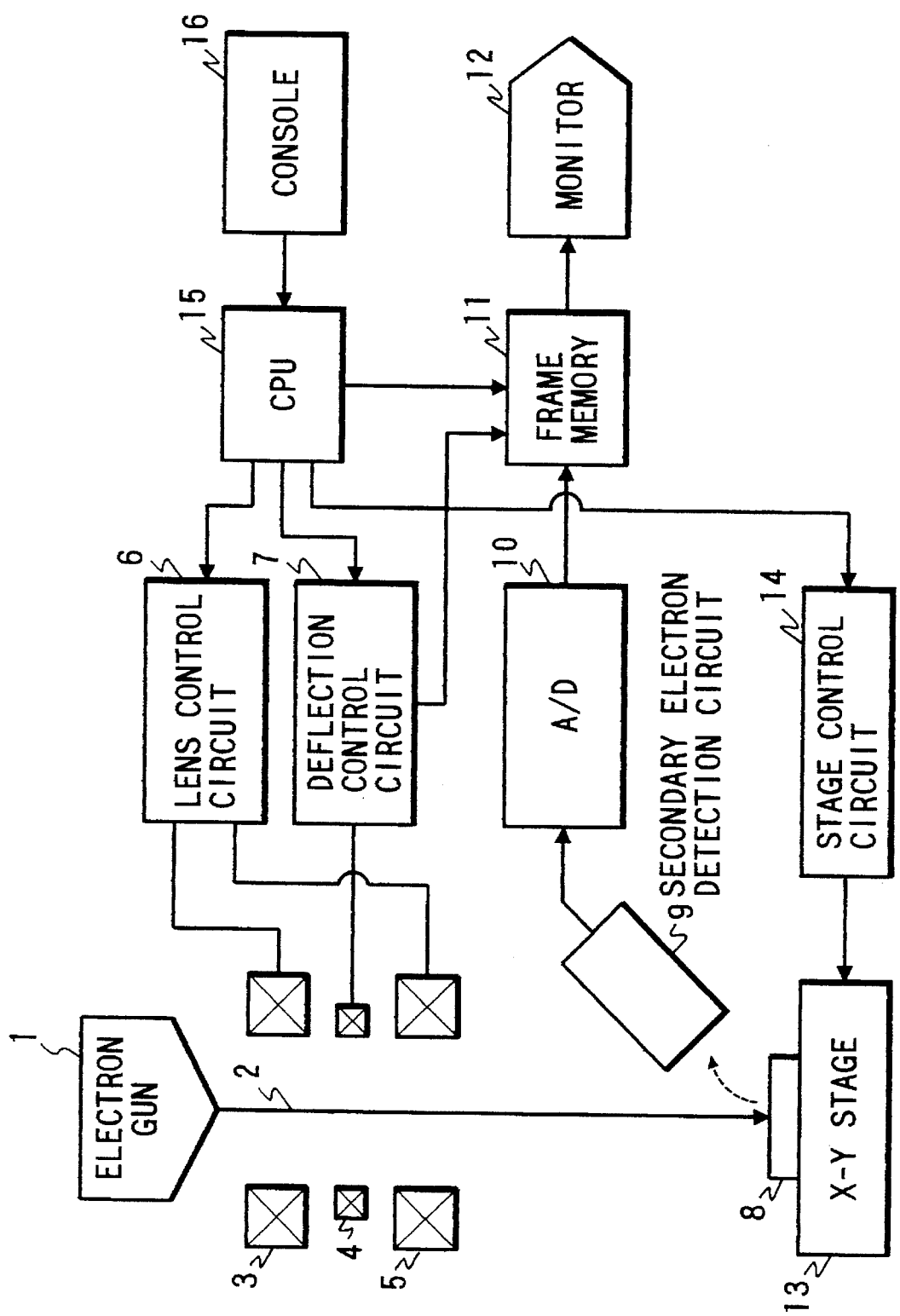
FIG. 1 a general block diagram showing an embodiment of a scanning electron microscope apparatus according to the present invention.
Figure 2A:
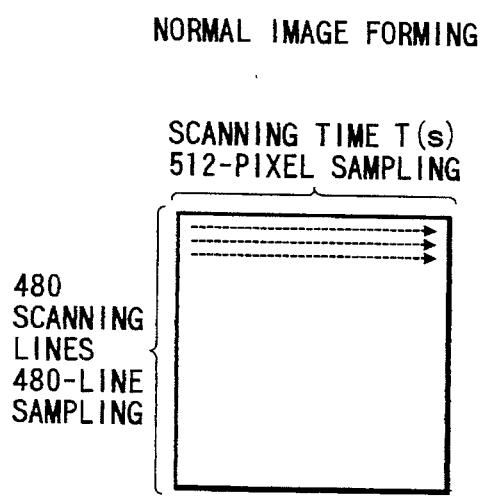
FIG. 2 is an illustration explaining the concept of the present invention.
Figure 2A:
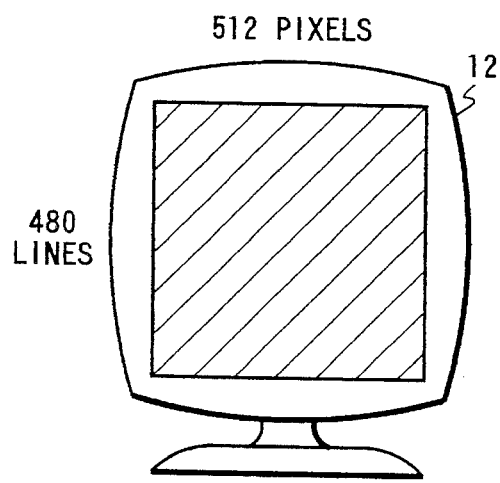
Figure 2B:
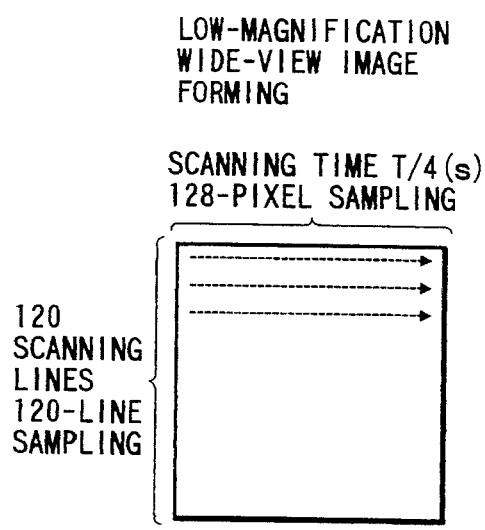
Figure 2B:
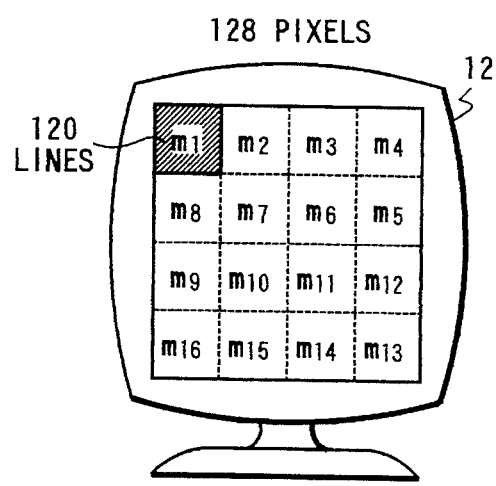

FIG. 1 shows the constitution of an embodiment of a scanning electron microscope according to the present invention. In the drawing, the numeral 1 indicates an electron gun, the numeral 2 an electron beam, the numeral 3 a focusing lens for focusing the electron beam 2, the numeral 4 a deflecting coil for deflecting and scanning the electron beam 2 in the X and Y directions, the numeral 5 an object lens, the numeral 6 a lens control circuit for controlling each lens, the numeral 7 a deflection control circuit for controlling the deflecting coil and image sampling timing, the numeral 8 a sample, and the numeral 9 a detector for secondary electrons and reflected electrons. A signal detected by the detector 9 is converted to a digital signal by an A-D converter 10 and stored in a frame memory 11. Image data in the frame memory 11 are put out to a monitor 12 at a TV rate so as to obtain an enlarged image of the sample 8 on the monitor 12. The numeral 13 indicates a sample moving stage for moving the sample in the X and Y axial directions by a motor and the sample moving stage is controlled by a stage control circuit 14. The series of control circuits mentioned above is managed by a CPU 15 and controlled in accordance with an instruction of a user input from a console 16.

FIG. 2 shows an image sampling method to form a low magnification and wide view image having the feature of the present invention.

FIG. 2 (A) shows an image sampling method when a normal image is formed, and FIG. 2 (B) shows an image sampling method when a low magnification and wide view image is formed. This embodiment shows a case where the frame memory for one picture is divided into 16 sections and the surface of a sample to be displayed is also divided into 16 sections, the image data obtained from the sample is stored in each of the corresponding areas in the frame memory.

Assuming that the display resolution of the monitor 12 is 512×480 pixels, the number of scanning lines of an electron beam for each frame is 480 or 480 plus a slight extra in the normal image forming state.

For displaying a very low magnification and wide view image, the number of scanning lines for each frame is set to 120. The value is the quotient when the normal number of scanning lines of 480 is divided by the number of the memory divisions of 4 in the vertical direction. The image sampling count is set to 128 which is the quotient when the normal number of sampling pixels of 512 for each scanning line is divided by the number of the memory divisions of 4 in the horizontal direction. As mentioned above, the number of pixels to be sampled is reduced to ¼ of that in the normal scanning state. Therefore, the scanning speed can be increased to 4 times as fast as that in the normal scanning state. As a result, the horizontal scanning time may be ¼ of that in the normal scanning state. Image data obtained by this scanning are reduced to ¼ in size at the image resolution of the frame memory, so that a frame is stored directly in the frame memory which displays very low magnification factor images without being subjected to the reduction processing and displayed on the monitor 12.

In other words, in the normal image forming state, as shown in FIG. 2. (A), the image data obtained by electron beam scanning is stored in the frame memory and directly displayed on the monitor as one picture. Next, in the low magnification and wide view image state, as shown in FIG. 2 (B), the image data obtained by scanning of one time is stored in the corresponding areas of the 16 sections in the frame memory and displayed as an image of 16 divided areas on the monitor 12. Therefore, by moving the position of the sample and repeating to scan electron beam on the sample, the image data of $m_1$~$m_{16}$ is stored in the frame memory and can be directly displayed as a low magnification and wide view image on the monitor 12.

FIG. 3 shows a flow chart to obtain a low magnification and wide view image according to the present invention, and is a flow chart of a program to be executed by the CPU 15 in FIG. 1. This figure shows a case where the frame memory is set to be divided into 16 areas as the same as in FIG. 2. The dividing number of the areas can be freely set by a user through the console 16.

When the number of divided areas (it is 16 areas here) is input from the console 16, the CPU 15 sets the number of divided areas of the frame memory 11 to 16 (Step 21). Next, lattice-shaped lines are set on the boundaries of the divided areas. The function of the lattice-shaped lines is to prevent difficulty caused by displacement of image from each of the areas. Then the apparatus moves the stage 13 to an initial position (position corresponding to $m_1$ in FIG. 2 (B)) (Step 23), sets the electron beam scanning time to T/4 (second), and sets the number of scanning lines to 120 (Step 24). Next, the apparatus sets the image memory recording range to 128×120 (Step 25). Then, the apparatus sets the frame memory record starting point ($m_1$) corresponding to the stage position (Step 26). The apparatus scans one frame according to the above settings and records a detected signal in the frame memory in which the above recording range is set (Step 27). When the scanning of one area and recording of the detected signal are completed, the apparatus decides whether the position of the sample moving stage 13 is the end position (Step 28). When the sample moving stage 13 does not reach the end position, the apparatus moves the sample moving stage 13 to the next position (Step 29) and repeats Steps 26 to 28. When the apparatus decides that the sample moving stage 13 reaches the end position, that is, $m_n$ at Step 28, the apparatus ends the processing. By doing this, the image data recorded in the frame memory, very low magnification and wide view images which are obtained by connecting the 16 reduced images, is displayed on the monitor 12.

The execution time in this embodiment can be expressed by the following formula.

[low magnification and wide view image forming time]= [stage moving time per section]×15+[scanning time per frame memory]×16.

Therefore, the apparatus can substantially shorten the image forming time comparing with a conventional apparatus in which 16 frame memories are used, and the necessary memory capacity can be realized with using one frame memory. More specifically, assuming [scanning time per frame memory]=10 (seconds) and [stage moving time per section]=2 (seconds), the necessary image forming time can be shortened up to 40 (seconds) from the conventional time of 190 (seconds). In addition to this, since the amount of electron beam irradiated on a sample can be reduced to $\frac{1}{16}$, the damage of the sample (for example, semiconductor, living thing or the like) can be substantially decreased.

According to this embodiment, low magnification and wide view images can be obtained in a short time compared with the conventional method and without a memory other than the frame memory for low magnification and wide view images being used.

In this embodiment, a case where the sample surface is divided into 16 sections is explained. However, the number of divisions is not limited to 16 sections.

The low magnification factor images obtained in this way may be dislocated between sections due to the moving accuracy of the sample stage and deflection distortion. The dislocation of images between sections can be concealed, for example, by overlaying and displaying a lattice line with a width of about 2 pixels on each section boundary of low magnification images as described in Step 21 in FIG. 3 if necessary.

What is claimed is:

1. An image forming method with a scanning electron microscope comprising, an electron beam scanner scanning an electron beam on a sample in a vertical direction and a horizontal direction substantially perpendicular thereto; a detector detecting electrons emitted from said sample by the scanning of said electron beam; and a memory for one picture for storing said detected signals as image data to form a composite image of said sample, comprising the steps of:

(a) dividing said frame memory for one picture into a plurality of areas in said vertical and horizontal directions;

(b) moving said sample; and (c) sequentially storing in said divided frame areas image data obtained from corresponding sample areas by movement of said sample and by scanning of said electron beam to form said composite image of said sample in said frame memory which is lower in magnification than a normal image.

2. The method according to claim 1, wherein the movement of said sample is executed area by area.

3. The method according to claim 1, further comprising the step of:

(d) displaying said formed low magnification image on a screen of a display.

4. The method according to claim 1, wherein the scanning of said electron beam is executed to form scanning lines parallel to one another arranged in said vertical direction, the number of said scanning lines being set at a value obtained by dividing the number of said scanning lines when said normal image is formed by the number of said divided frame areas in said vertical direction.

5. The method according to claim 1, wherein the scanning of said electron beam is executed to from scanning lines parallel to one another arranged in said vertical direction, a scanning time per scanning line being set at a value obtained by dividing a scanning time per scanning lines when said normal image is formed by the number of said divided frame areas in said horizontal direction.

6. A scanning electron microscope comprising:

an electron gun;

a lens focusing an electron beam generated from said electron gun;

an electron beam deflection controller scanning said electron beam focused by said focusing lens on a sample in a vertical direction and a horizontal direction substantially perpendicular thereto to thereby form scanning lines parallel to one another in said vertical direction;

a detector detecting electrons emitted from said sample by irradiation of said electron beam and providing output electrical signals;

a frame memory storing said output signals as image data, said frame memory being divided into a plurality of areas in said vertical and horizontal directions;

means for moving said sample; and means for setting the number of said divided areas of said frame memory, wherein said electron beam deflection controller being provided with means for setting the number of said vertical scanning lines at a first magnification at a value obtained by dividing the number of said scanning lines at a second magnification higher than said first magnification by the number of said divided frame areas in said vertical direction and for setting a horizontal scanning time per scanning line at said first magnification at a value obtained by dividing a horizontal scanning time per scanning line at said second magnification by the number of said divided frame areas in said horizontal direction so as to store, in said divided frame areas, image data obtained from corresponding areas of said sample by movement of said sample and by scanning of said electron beam.

7. A scanning electron microscope according to claim 6, further comprising:

means for overlaying and displaying a lattice-shaped line on the boundary of each area of said frame memory.

8. A scanning electron microscope according to claim 6, further comprising:

an image display for displaying said image data stored in said frame memory, wherein said sample moving means further comprises means for moving said sample area by area.

* * * * *

UNITED STATES PATENT AND TRADEMARK OFFICE
CERTIFICATE OF CORRECTION

PATENT NO. : 5,523,567
DATED : June 4, 1996
INVENTOR(S) : Shigeru KAWAMATA et al.

It is certified that error appears in the above-indentified patent and that said Letters Patent is hereby corrected as shown below:

| Column | Line | |
|---|---|---|
| 2 | 3 | Before "low" delete "a". |
| 4 | 14 | Change "comparing" to --compared--. |
| 4 | 16 | Change "with" to --by--. |
| 5 | 9 | Change "from" to --form--. |

Signed and Sealed this

Fifth Day of November, 1996

Attest:

BRUCE LEHMAN

*Attesting Officer*   *Commissioner of Patents and Trademarks*